United States Patent [19]

Ferguson

[11] Patent Number: 4,780,685
[45] Date of Patent: Oct. 25, 1988

[54] COMPOSITE POWER AMPLIFIER WITH REDUNDANCY

[75] Inventor: Donald A. Ferguson, Eastampton, N.J.

[73] Assignee: General Electric Company, East Windsor, N.J.

[21] Appl. No.: 27,927

[22] Filed: Mar. 19, 1987

[51] Int. Cl.[4] .............................................. H03F 3/68
[52] U.S. Cl. ................................ 330/124 D; 330/51; 330/56; 330/295; 455/8
[58] Field of Search ............... 330/51, 53, 56, 124 R, 330/124 D, 286, 295; 333/2, 3, 101–108; 455/8

[56] References Cited

U.S. PATENT DOCUMENTS

| | | | |
|---|---|---|---|
| 4,285,346 | 8/1981 | Armitage | 128/422 |
| 4,315,222 | 2/1982 | Saleh | 330/124 D |
| 4,641,106 | 2/1987 | Belohoubek et al. | 330/286 |
| 4,697,160 | 9/1987 | Clark | 333/103 |

OTHER PUBLICATIONS

Moody et al., "Redundancy Switching of Amplifiers in Satellites", *RCA Technical Notes*, TN No. 1182, Jun. 10, 1977.

Primary Examiner—James B. Mullins
Attorney, Agent, or Firm—Clement A. Berard, Jr.; William H. Meise

[57] ABSTRACT

A power combiner includes an input power splitter driving a plurality (N) of amplifiers. The amplifier outputs have $Z_0$ output impedance and are coupled by transmission (TX) lines of $Z_0$ characteristic impedance to the junction point of a lossless power combiner. Short-circuiting switches located $\lambda/4$ from the junction power disconnect failed amplifiers from the combiner. According to the invention, a number $M<N$ of the shorting switches are open during normal operation, so the impedance presented by the parallel TX lines at the junction of the combiner is $Z_0/M$. An impedance transformer associated with the combiner transforms the junction point impedance $Z_0/M$ to $Z_0$ at the combined output port, for example, by a $\lambda/4$ line having an impedance $\sqrt{Z_0^2/M}$. For control purposes, when an amplifier fails, it is disconnected by closing its shorting switch, and the shorting switch of a redundant amplifier is opened, so the impedance at the junction point remains the same.

11 Claims, 5 Drawing Sheets

COMPOSITE POWER AMPLIFIER WITH REDUNDANCY

This invention relates to composite power amplifiers in which the output powers from a plurality of separate amplifiers or amplifier modules are combined to produce the high power output signal.

Earth satellites are finding increasing use as transponders for communications systems. The use of satellites for communication links between cities eliminates the need for land communication cables, which are very costly. In order to provide continuous coverage, a satellite must be in a geosynchronous orbit. Such orbits require that the satellite be at an altitude of about 22,000 miles. Thus, communications by way of a geosynchronous satellite requires transmission over a path length of 22,000 miles to the satellite and transmission from the satellite over a 22,000 mile path length to the receiving earth station. Transmission over such a distance requires relatively high antenna gain. The necessary gain is achievable with antennas of reasonable size and reasonable cost only at microwave frequencies and at frequencies higher than microwave.

The transmission of signal from the satelite to the earth station requires a power amplifier located in the satellite capable of generating tens or hundreds of watts of microwave power with great reliability. In the past, the microwave power was generated by traveling wave tubes (TWT). Traveling wave tubes were, and continue to be, used for satellite transmitters notwithstanding the reliability problem attributable to the inherent degradation resulting from operation over a period of time. More recently, solid state power amplifiers (SSPA) have been used at lower microwave frequencies, such as at C-band, instead of traveling wave tubes. The SSPA has no inherent degradation mechanism, and therefore is more reliable than the TWT. Generally speaking, solid state power amplifiers are implemented by using a large number of relatively low power solid state devices or amplifier modules. Each solid state device provides a small portion of the total output power, and power combiners are used to combine the powers from each of the individual solid state devices to generate the desired amount of signal power at the desired microwave or millimeter wave frequencies.

Various types of power combiners are described in the article "Microwave Power Combining Techniques" by Kenneth J. Russell, published in the *IEEE Transactions on Microwave Theory and Techniques*, May 1979. The Russell article describes corporate or tree combiners, in which chains of combination are performed. Such arrangements tend to be disadvantageous because of the cumulation of losses in the combiners. It is extremely desirable that the power combination be performed with low loss. U.S. Pat. No. 4,641,106 issued Feb. 3, 1987 to Belohoubek et al. describes a low-loss radial power combiner. The radial power combiner is very advantageous when a large number of individual solid state amplifiers have their outputs combined. If one of the amplifiers fails, the net effect on the overall operation is small. However, if a large proportion of the amplifiers should fail, there might be significant degradation of the impedance match and combiner loss, and therefore also a degradation in the amplifier gain.

When a relatively small number of solid state power amplifier modules are to have their output powers combined, a low-loss combiner may be disadvantageous, because failure of a single solid state amplifier module may constitute a failure of a significant proportion of the total number of amplifier modules, and result in perturbation of the performance. Consequently, different considerations may govern power amplifiers using combination of power when relatively few amplifier outputs are combined, compared with the situation which exists when relatively large numbers are combined, as in the Belohoubek et al. patent.

U.S. Pat. No. 4,315,222 issued Feb. 9, 1982 to Saleh describes a powe combiner arrangement in which the output power from a plurality of amplifier modules is combined at a single junction. Each amplifier module is coupled to the junction by a transmission line having an electrical length of one-quarter wavelength ($\lambda/4$) at the center of the frequency of operation. A sensing arrangement is coupled to each amplifier module and, in the event of failure of the amplifier, decouples the amplifier from the combining junction by way of a switch which effectively decouples the amplifier and its transmission line from the juncture. In one embodiment of the Saleh arrangement, a short-circuiting switch located at the amplifier output is closed to reflect or present an open circuit to the combining point. The arrangement of the Saleh patent has the disadvantages that an amplifier failure results in a reduction in the output power, the failure of an amplifier and the operation of the switch which decouples it from the combining junction results in a change in the impedance at the junction, and also the source impedance of the combined output is not well matched and changes depending upon the number of amplifiers which at the moment happen to be in operation.

A power amplifier of the combining type is desired in which the combining is performed in a low-loss manner, which is reliable, and in which failure of an amplifier does not necessarily result in a change in the impedance at the junction point, and in which the output terminal is well matched.

SUMMARY OF THE INVENTION

A composite amplifier arrangement for amplifying signals from a source of signal includes a power divider coupled to the source of signal for dividing the incident signal into a plurality (N) of equal-amplitude signal portions. Each of the plurality of equal-amplitude portions is produced at one of N output terminals of the power divider. The composite amplifier also includes a plurality N of amplifier modules, each of which includes an input terminal coupled to one of the N output terminals of the power divider for receiving one of the equal signal portions. Each of the amplifier modules also includes an output terminal at which amplified signal is produced. A power combiner includes N input terminals joined at a junction, and also includes an output terminal having a characteristic impedance $Z_1$. The power combining arrangement includes an impedance transformer coupled between the output terminal and the junction. The impedance transformer provides an impedance transformation between $Z_1$ and $Z_2$, where $Z_2$ equals $Z_1$ divided by M, where M is an integer less than N. A plurality of transmission lines, N in number, is provided. Each transmission line is coupled between the output terminal of one of the amplifiers and one of the input terminals of the power combiner. Each of the transmission lines in one embodiment of the invention has an electrical length at least equal to one-quarter wavelength at a frequency near the center of the band of frequencies over which the composite amplifier is designed to operate. Each of the transmission lines has a characteristic impedance equal to $Z_1$. A plurality of switches, N in number, is associated with the composite amplifier. Each of the switches is associated with one of the transmission lines and in a first state couples an amplifier module to the junction and, in a second state, couples a length of transmission line to the junction. The electrical length of the transmission line coupled to the junction in the second operating mode of the switch is equal to the product of a sum multiplied by one-quarter wavelength, where the sum is the sum of one plus twice a second integer. The second integer may be 0, 1, 2 . . . . A control arrangement is coupled to the switches for setting M of the switches to the first state and the remainder of the switches to the second state.

DETAILED DESCRIPTION OF THE INVENTION

Figure 1:
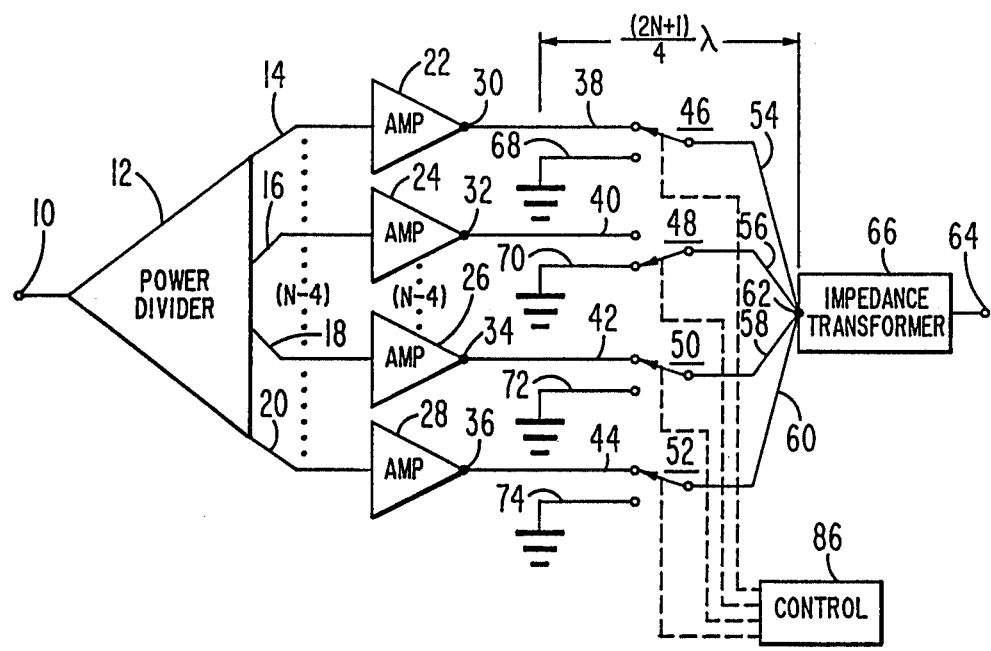
FIG. 1 is a block diagram of a composite amplifier according to the invention, illustrating power combination at a junction and an impedance transformer.

FIG. 1 is a block diagram of a composite amplifier 1 according to the invention. In FIG. 1, an input terminal 10 receives signal to be amplified. The signal may be, for example, a signal in the range of 2.5 GHz. The signal applied to input terminal 10 is coupled to a power divider 12 which divides the amplitude of the applied signal and produces in-phase, equal-amplitude samples on a plurality N of output conductors 14, 16, . . . 18, 20. Since four output conductors (14, 16, 18, 20) are illustrated, N-4 conductors are not illustrated. Power divider 12 may be any conventional type of power divider. Ordinarily, output conductors 14-20 are in the form of transmission lines, and power divider 12 has an output impedance which is intended to match the characteristic impedance of the transmission lines. Impedances of 50 and 75 ohms are common in signal applications.

The in-phase, equal-amplitude signal portions produced on conductors 14-20 are coupled to a plurality N of amplifier modules, illustrated as 22, 24 . . . 26, 28. Ordinarily, the input impedances of amplifier modules 22-28 are nominally matched to the output impedance of output power divider 12. However, those skilled in the art realize that the matching of active devices will often be imperfect. These amplifier modules have equal gains and equal phase characteristics, or if the gains and phases are unequal, gain and phase equalization arrangements (not illustrated) are provided in known manner. Amplifier modules are hereinafter referred to as amplifiers.

Amplifier 22 produces an amplified signal sample at its output terminal 30 and on a transmission line 38. Similarly, amplifier 24 produces its amplified signal sample at an output terminal 32 and on a transmission line 40. Amplifier 26 produces its amplified signal sample at its output terminal 34 and on transmission line 42, and amplifier 28 produces its amplified signal sample at output terminal 36 and on transmission line 44. Transmission line 38 is connected to the upper switched terminal of a single pole, double throw (SPDT) switch 46, and, in the illustrated position of switch 46, by the common terminal of the switch and by a transmission line 54 to a junction 62. Switch 46 and other switches are illustrated as being mechanical in nature, but those skilled in the art know that well-known equivalent electrical switches may be used. Transmission line 40 is coupled to the upper switched terminal of a SPDT switch 48 and, in the illustrated position of switch 48, terminates on the upper terminal. Transmission line 42 is coupled to the upper switched terminal of a SPDT switch 50 and, in the illustrated position of switch 50, is coupled by way of the common terminal and a transmission line 58 to junction point 62. Transmission line 44 is coupled to the upper switched terminal of a SPDT switch 52 and, by way of the common terminal of switch 52 and by a transmission line 60 to common junction 62. The lower switched terminals of SPDT switches 46, 48, 50 and 52 are coupled by transmission lines 68, 70, 72 and 74, respectively, to ground.

Generally speaking, the output impedances of amplifiers 22-28 at their output terminals 30-36 are designed to have a selected impedance, which is often 50 or 75 ohms. Transmission lines 38-44, 54-60 and 68-74 are normally selected to have a characteristic impedance which corresponds to the amplifier output impedance. If more than one of switches 46-52 are in a state which connects their common terminal to the upper switched terminal, the impedance at junction point 62 will be lower than the characteristic impedance of the transmission lines. It is normally desirable that the impedance at output terminal 64 of the composite amplifier 1 illustrated in FIG. 1 be equal to the characteristic impedance of the transmission lines of the system. However, the impedance at junction 62 will be lower in a proportion established by the number, designated M, of amplifiers which are coupled to junction point 62. In general, M will be less than N. As illustrated in FIG. 1, amplifiers 22, 26 and 28 are coupled to junction point 62, and amplifier 24 is not coupled to junction point 62. Consequently, if the output impedance at output terminal 64 is designated $Z_1$ and the impedance at junction point 62 is designated $Z_2$, the impedance at junction point 62 for the switch positions illustrated therein will be $$Z_2 = Z_1/M \quad (1)$$

where M is equal to 3 for the switch positions illustrated in FIG. 1.

According to an aspect of the invention, the electrical length between junction point 62 and the short circuit of a short-circuited transmission line 68-74 by way of a switch 46-52 is an odd multiple of a quarter wavelength, or more formally the electrical length L is defined by $$L = (2N+1)\lambda/4 \quad (2)$$

where N=0, 1, 2 . . . . Such a length causes the short circuit to appear as an open circuit at the junction point, thereby producing essentially no impedance effect on the junction. For example, with switches 46–52 in the positions illustrated in FIG. 1, amplifiers 22, 34 and 36 are coupled to junction 62, and switch 48 couples a short-circuit to junction 62 by way of a transmission line having a length of λ/4. Under these conditions, the short-circuit does not affect the impedance at junction 62, which continues to have an impedance of $Z_1/M$. Those skilled in the art know that bandwidth decreases as integer M increases.

Impedance transformer 66 converts impedance $Z_2$ at junction point 62 to impedance $Z_1$ at output terminal 64. Impedance transformer 66 may, as known, be in the form of a transmission line having an electrical length equal to one-quarter wavelength at the center of the frequency of operation and having an impedance which is the square root of the product of the impedances at its end. The characteristic impedance $Z_0$ of the transmission line is described mathematically as $$Z_0 = \sqrt{Z_1 A_2} \qquad (3)$$

As so far described, the arrangement of FIG. 1 provides the desired output impedance at output terminal 64, and includes a plurality N of amplifiers, of which a lesser number M are in operation. A control arrangement illustrated as a block 86 is coupled to switches 46–52 for controlling their operating state. Control arrangement 86 controls switches 46–52 so that no more than M amplifiers are coupled to junction point 62 at any one time. Thus, in the event that an operating amplifier such as 22 should fail, the configuration of switch 46 could be reset by control logic 86 to couple the common terminal of switch 46 to the lower switch terminal, thereby decoupling amplifier 22 from junction 62 and connecting short-circuited transmission line 68 to junction 62 instead, and further by resetting the position of switch 48 to decouple the common terminal from the lower switched terminal and couple it instead to the upper switched terminal, thereby decoupling short-circuited transmission line 70 from junction point 62 and connecting redundant amplifier 24 to junction point 62. Such control requires that control logic block 86 be coupled by paths (not illustrated) to amplifiers 22–28.

With the illustrated arrangement and the described connections and control, the composite amplifier of FIG. 1 simultaneously provides the reliability of redundant amplifiers together with impedances at output terminal 64 which remain invariant despite failures of amplifier modules. Naturally, if the number of amplifiers which fail exceeds the number of redundant amplifiers available as substitutes, the impedance will be degraded.

Figure 2B:
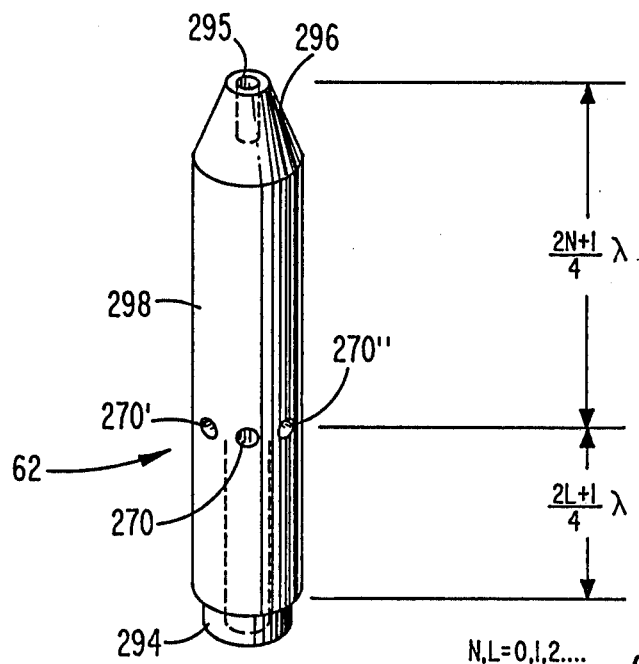
FIGS. 2a and 2b, referred to together as FIG. 2, are (FIG. 2a) an exploded perspective view of that portion of the arrangement of FIG. 1 which performs the low-loss combination at a junction and impedance transformation and includes an illustration of a center conductor, and (FIG. 2b) illustrates an alternative arrangement of the center conductor of the impedance transforming section illustrated in FIG. 2a for providing improved heat sinking.
Figure 2A:
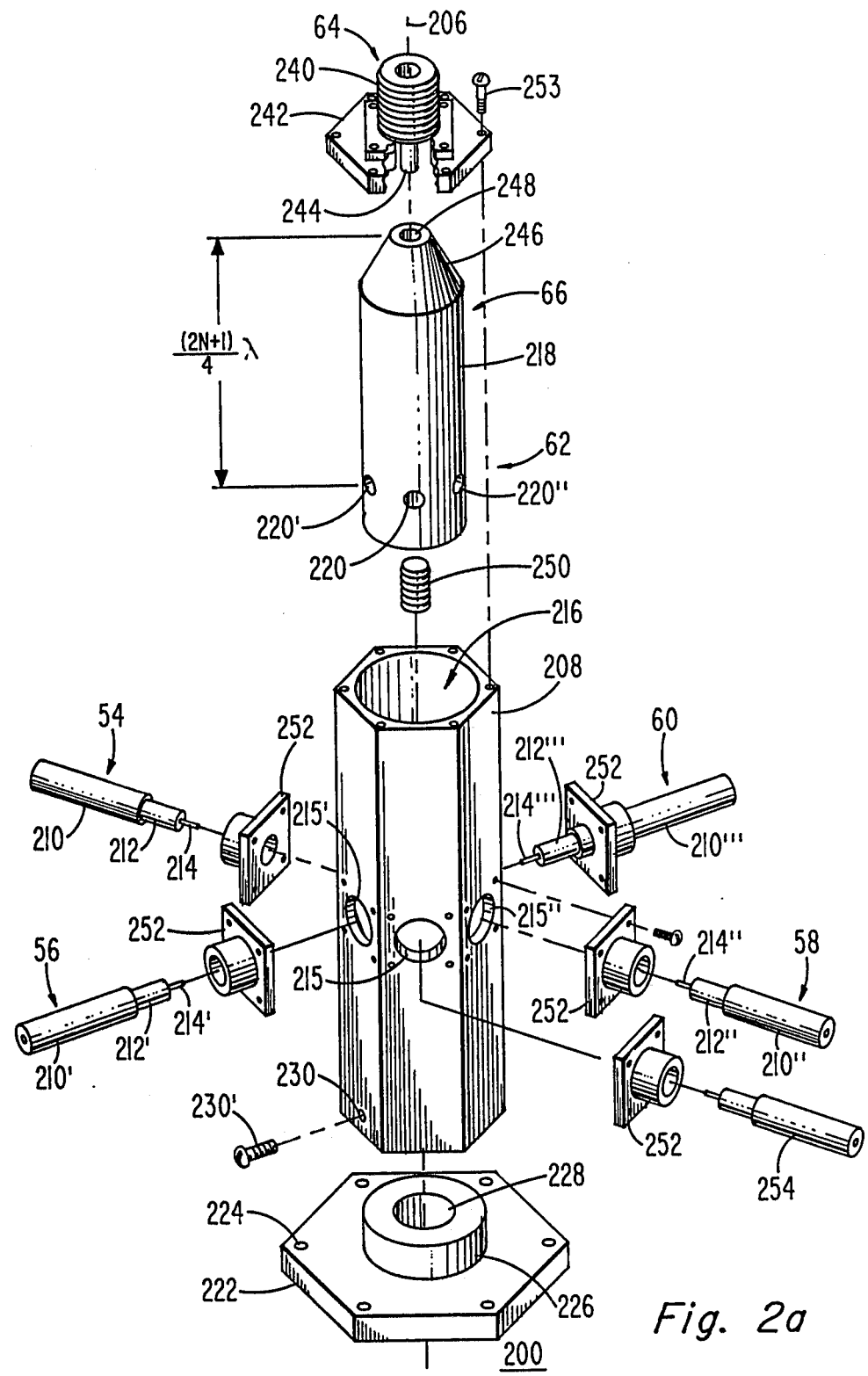

FIG. 2a is an exploded perspective view of a structure suitable for use in conjunction with a total number N of amplifiers equal to 6, which provides a low impedance junction point and an impedance transformation to an output terminal. In FIG. 2a, elements corresponding to those of FIG. 1 are designated by the same reference numeral. In FIG. 2a, an elongated conductive housing 208 has a cross-sectional shape which defines a hexagon, and includes a central bore 216, the inner surface of which forms the outer conductor of a transmission line, as described below. In the arrangement of FIG. 2a, transmission lines 54, 56, 58 and 62 are coaxial transmission lines which include a semirigid outer conductor, a dielectric material and a coaxial inner conductor. Thus, transmission line 54 includes an outer conductor 210, dielectric material 212 and center conductor 214. Similarly, the outer conductor of transmission line 56 as illustrated in FIG. 2a is designated 210', its dielectric is designated 212', and its center conductor 214'. The components of transmission line 58 are designated by 210, 212 and 214 with a double prime, and transmission line 62 carries a triple prime designation. Also illustrated in FIG. 2a is a fifth transmission line 254, and a sixth transmission line, which would be hidden behind housing 208, is not illustrated.

Each flat side of hexagonal housing 208 includes a through aperture. Three apertures 215, 215' and 215" are visible. Apertures 215 are dimensioned to clear the outer conductor of coaxial transmission lines 54–60, and 254. Smaller threaded holes (not separately designated) arranged in a square pattern around each aperture 215 accept screws (not illustrated) for fastening flanges illustrated as 252.

Also illustrated in FIG. 2a is an elongated conductor 218 having a diameter smaller than the diameter of bore 216. Conductor 218 is dimensioned to act in conjunction with the inner surface of bore 216 as the center conductor of a transmission line having a selected impedance. Region 62 of conductor 218 is the junction and includes a plurality of holes, one of which is designated 220, which are dimensioned for receiving the center conductors of transmission lines 54–62 when the transmission lines are inserted into apertures 215. In particular, that hole designated 220' receives center conductor 214' of transmission line 56, and hole 220" receives center conductor 214" of transmission line 58.

A mounting base 222 includes a hexagonal portion with mounting holes, one of which is designated 224, for mounting the structure to a support (not illustrated), and further includes a cylindrical portion 226 having an outer diameter equal to the inside diameter of bore 216. Mounting base 222 further includes a through central aperture 228 which provides screwdriver access to the interior of bore 216 after assembly. If desired, one or more threaded holes 230 and screws 230' may be provided to captivate mounting flange 222 to housing 208.

A commercial coaxial connector such as the type known as type N is illustrated as 240, and is mounted on a hexagonal conductive plate 42 with its center conductor 244 protruding through a central aperture therein. Elongated conductor 218 includes a tapered end portion 246 and an axial aperture 248 dimensioned to receive center conductor 244 of connector 240. Tapered portion 246 decreases the electrical field strength between transformer 66 and hexagonal plate 242 to avoid corona discharge or multipactor breakdown in reduced ambient pressure environments, and also compensates for capacitive end effects. Elongated conductor 218 also includes a threaded axial aperture extending from its bottom, and therefore not visible in FIG. 2a, which extends as far as the plane of holes 220. A set screw 250 is threaded into the bottom aperture.

Each of transmission lines 54–62, and transmission line 254 and the further transmission line (not illustrated) are each associated with one of conductive flanges 252. Each conductive flange includes clearance holes for mounting screws (not illustrated) for mounting the flange to a face of housing 208, as described above, and also includes an annular portion adapted for receiving the outer conductor (210) of its associated transmission line.

The arrangement of FIG. 2a is assembled by mounting a flange 252 onto the outer conductor of its associated transmission line as illustrated in conjunction with transmission line 62, and soldering the outer conductor to the annulus of the flange. Connector 240 is assembled to hexagonal plate 242, and axial upper aperture 248 of elongated conductor 218 is soldered to center conductor 244 of connector 240. The assembly of connector 240, plate 242, and elongated conductor 218 is lowered into bore 216 until plate 242 contacts the end of housing 208, and plate 242 is then fastened to housing 208 with screws, one of which is illustrated as 254. The center conductors of the transmission lines 54–62 (already assembled to flanges 252), are inserted into apertures 215, and the center conductors are fitted into holes 220 in elongated conductor 218. When properly dimensioned, each flange 252 should bottom against one of the hexagonal faces of housing 208 as the transmission line dielectric 212 butts against the outer surface of elongated conductor 218. The flanges 252 are fastened to housing 208, and mounting base 222 is fastened in place. Screw 250 is then tightened with a screwdriver inserted through hole 228 in support flange 222 to capture the center conductors such as 214 within elongated conductor 218.

FIG. 2b is a perspective view of an alternative configuration of elongated conductor 218 of FIG. 2a. Elongated conductor of FIG. 2b is designated 298 to distinguish it from that of FIG. 2a. Conductor 298 includes the tapered portion 296 corresponding to tapered portion 246 of elongated conductor 218, and further includes an aperture 295 corresponding in form and function to aperture 248 of conductor 218 of FIG. 2a. Similarly, conductor 298 includes a plurality of holes designated 270, 270', 270'' ... located in a manner similar to that of holes 220 of FIG. 2a. Conductor 298 differs somewhat in structure from conductor 218, and is intended to be capable of dissipating a larger amount of heat, so that it may be used for combining higher powers than the arrangement illustrated in FIG. 2a. The ability to dissipate a greater amount of heat is provided by a conductive extension remote from taper 296 and central aperture 295 which includes a necked region 294 dimensioned to fit within aperture 228 of mounting base 222 of FIG. 2a and to make intimate contact therewith. Thus, a thermally conductive path extends from junction point 62 through mounting base 222 to the supporting structure (not illustrated). The additional portion of conductor 298 which extends from holes 270 to necked portion 294 is dimensioned to a length P which is an odd multiple of a quarter wavelength, $$P = (2L+1)\lambda/4 \text{ (tm)} \quad (4)$$

where L=0, 1, 2 ... in order to minimize its effect on the impedance at junction 62. A threaded axial aperture allows screw 250 to capture the center conductors of the various transmission lines as in the arrangement of FIG. 2a.

Figure 3:
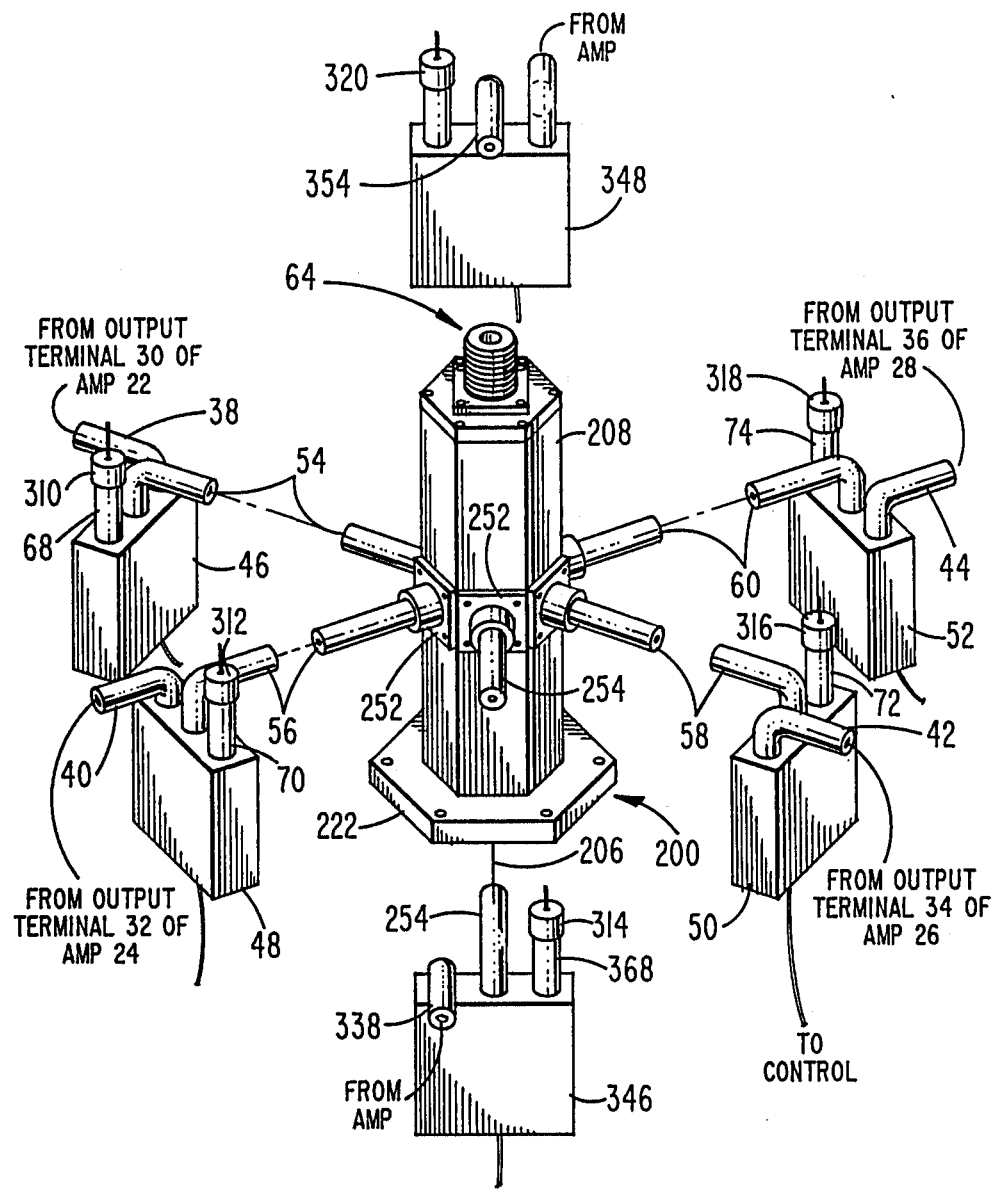
FIG. 3 is an exploded perspective view of the physical arrangement of switches and the combining arrangement of FIG. 2.

FIG. 3 is a perspective view, partially exploded, illustrating how the various switches and short-circuited transmission lines are assembled together with the assembly of FIG. 2a. In FIG. 3, elements corresponding to those of FIGS. 1 and 2 are designated by the same reference numerals. In the arrangement of FIGURE 3, switches 46, 48, 50 and 52, and further switches 346 and 348 are arranged in a hexagonal configuration about, and somewhat spaced from, combiner assembly 200.

The switches and support flange 222 of combiner assembly 200 are supported by a support plate (not illustrated). Switches 46–348 are coaxial SPDT switches such as type DOSQ switches manufactured by Transco Products, Incorporated, of 4241 Glencoe Ave, Venice, Calif. 90291. These switches are fitted with coaxial connectors, which are not illustrated in order to simplify the drawing. Switch 52 as illustrated in FIG. 3 is typical. Semirigid coaxial transmission line 60 (coax) is connected to the upper surface of switch 52 and is internally connected to the common terminal of the switch. Coax 44 is connected to one of the switched terminals and, at the remote end as illustrated in FIG. 3, is adapted to be coupled to output terminal 36 of amplifier 28. Transmission line 74 is connected to the second switched terminal of SPDT switch 52 and extends along a line parallel to the axis 206 of combiner assembly 200. At a selected distance from switch 52, a copper cap 318 is fitted over the outer conductor of coax transmission line 74. A portion of the center conductor of coax 74 protrudes through the end of cap 318. Cap 318 provides a minor amount of adjustment capability which allows the electrical position of the short circuit associated with switch 52 to be precisely set. After it is set in the desired position, the protruding center conductor is soldered to cap 318, and cap 318 is soldered to the outer conductor of coax 74. The other switches are similar to switch 52, and no further description is necessary.

Figure 4:
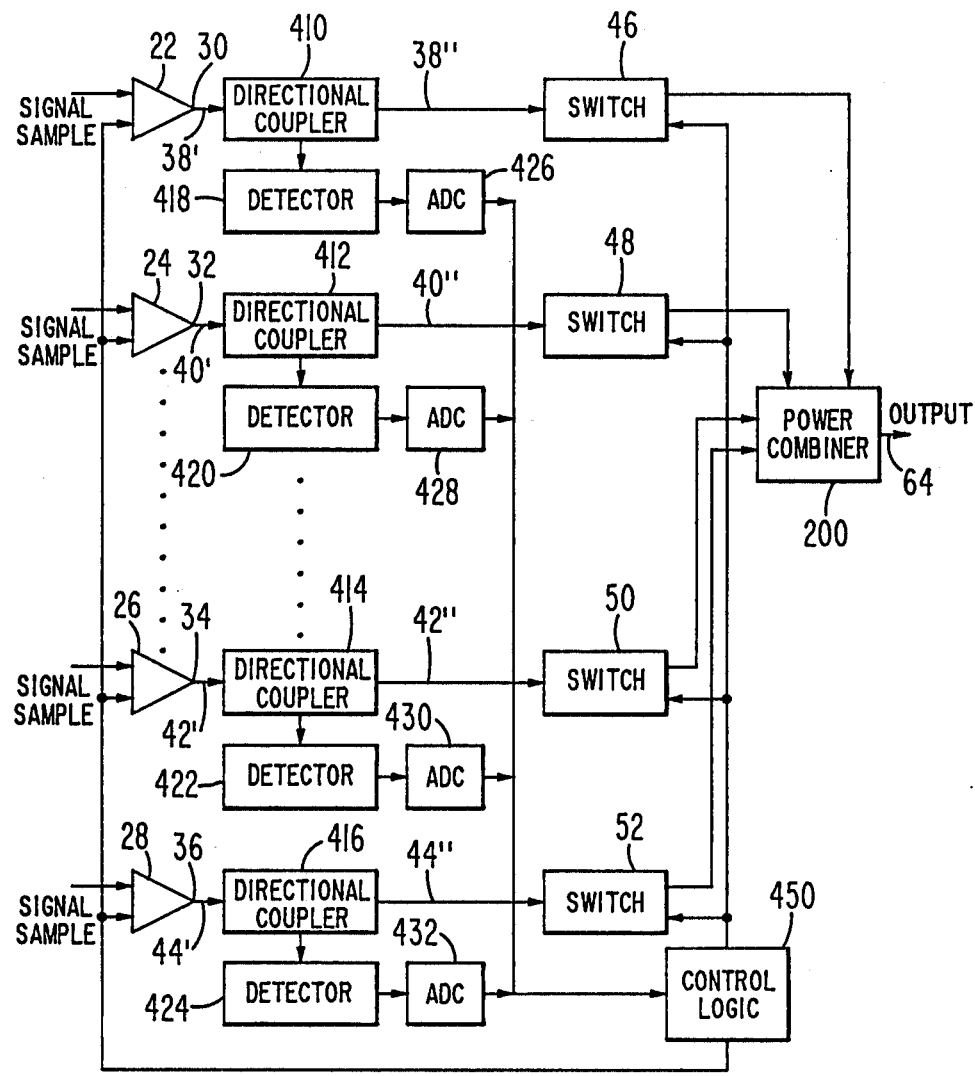
FIG. 4 is a block diagram of portions of FIG. 1, illustrating details of the control arrangement.

FIG. 4 is a block diagram illustrating a portion of the arrangement of FIG. 1, and includes details of the control arrangement. In FIG. 4, elements corresponding to those of FIGS. 1 and 2 are designated by the same reference numeral. In FIG. 4, output terminal 30 of amplifier 22 is coupled to a signal sampler, which as illustrated is a directional coupler 410. Coupler 410 has its through path coupled between portions 38' and 38'' of transmission line 38, and couples slightly attenuated signal to switch 46. Coupler 410 also couples a small sample of the signal to a detector 418, which converts the signal nto a direct voltage, the amplitude of which is responsive to the signal power produced at output 30 of amplifier 22. The direct voltage is applied from detector 418 to an analog-to-digital converter (ADC) 426, which converts the direct voltage into a corresponding set of binary numbers (a digital signal). The digital signal is applied to control logic illustrated as a block 450.

Similarly, a directional coupler 412 interposed between portions 40' and 40'' of transmission line 40 samples the output signal from amplifier 24, and applies the sample to a detector 420 for producing an analog power-responsive voltage, which is converted by ADC 428 into a digital signal for application to control logic 450. Other directional couplers 414 and 416 coact with detectors 422 and 424, respectively, and with ADC 430 and 432, respectively, to produce digital signals which control logic 450 uses to determine the operating status of the amplifiers.

Control logic 450 processes the signals and generates control signals which establish the operating state of switches 46–52 and (by connections which are not illustrated) the energization of amplifiers 22-28.

Figure 5:
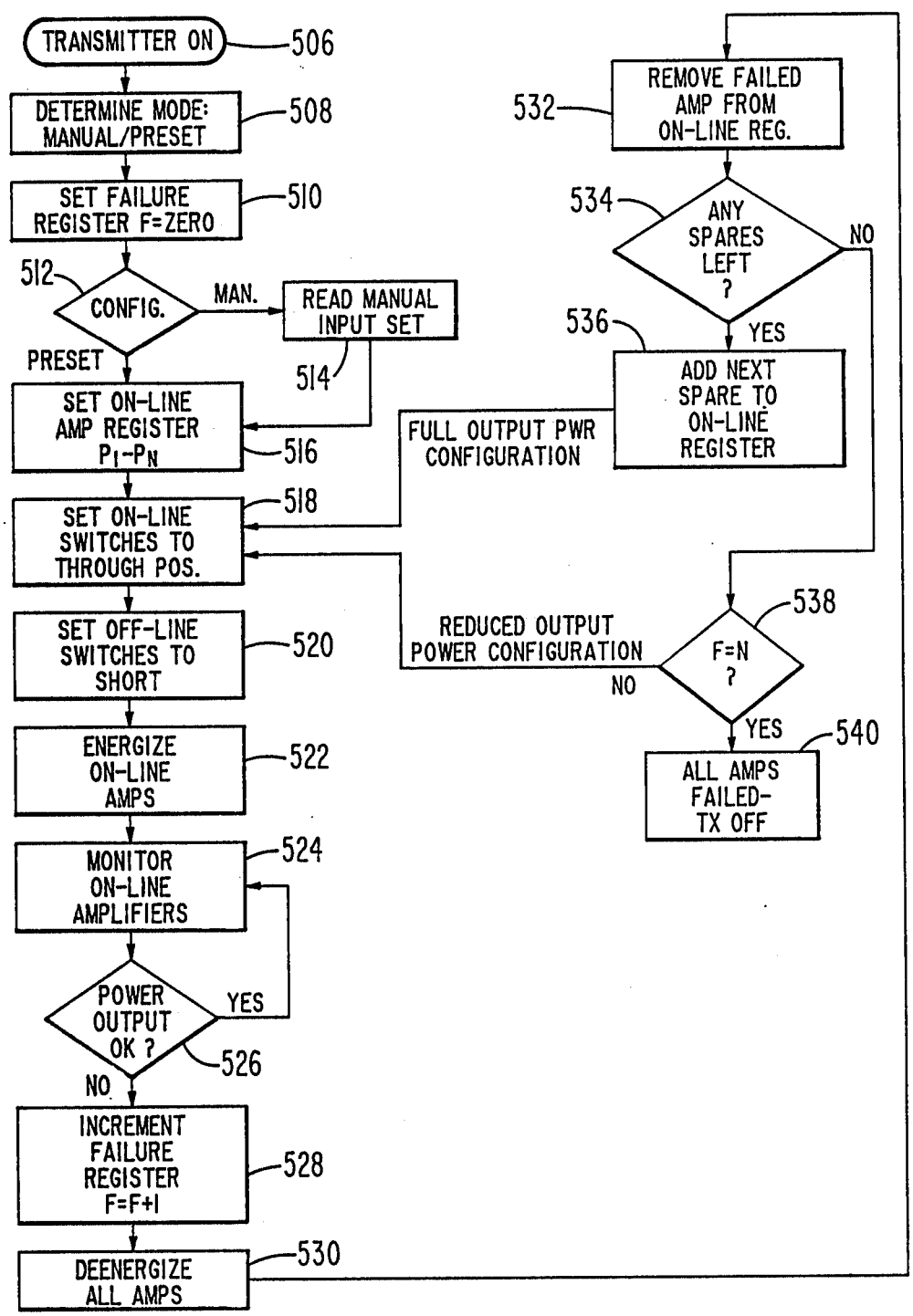
FIG. 5 is a flow chart describing control logic flow.

FIG. 5 is a simplified flow chart illustrating one possible flow of control logic in control logic 450 of FIG. 4. In FIG. 5, the logic begins with a command 506 to turn on the composite amplifier ("transmitter"). The logic proceeds to block 508, where the operating mode is determined by examining the state of a PRESET/MANUAL command. A failure register internal to control logic 450 (FIG. 4) has a memory location assigned to each amplifier (thus, when there are six amplifiers, there are six memory locations). In logic block 510, the states F of these memory locations are initially set to logic zero, representing no failure (all amplifiers are in operating condition or "good"). The logic proceeds to a decision block 512, in which the operating mode directs the logic. In the manual mode, the manual setting inputs are read, as represented by a block 514. These manual settings select those M<N amplifiers which will initially be on-line. The manual settings set the on-line register in logic block 516. In the preset mode, the logic flows directly from decision block 512 to block 516, retaining the current on-line register setting.

From block 516, the logic flows to a block 518, which represents the setting of those switches from among switches 46-52 associated with on-line amplifiers to the through position (common terminal coupled to the upper switched terminal, as illustrated in FIG. 1). From block 518, the logic proceeds to a block 520, representing the setting of the remaining switches from among switches 46-52 to the short-circuit condition (common terminal connected to the lower switched terminal, as illustrated in FIG. 1). All change of state of switches 46-52 is performed with the amplifiers deenergized, in one embodiment of the invention, because of limitations on the amount of power which can be reliably switched. For this reason, block 522 represents the energization of the on-line amps. Once logic block 522 has been reached, the composite amplifier is in its normal operating state, with M amplifiers operating on-line, with their outputs coupled to combiner 200, and the N−M remaining amplifiers waiting in a deenergized state for activation in the event of failure among the on-line amps. The switches associated with the off-line amplifiers are in the position coupling the short-circuited transmission line to the combining point, whereby the short-circuit reflects an open-circuit to the combining point. In this condition, the impedance at output terminal 64 of FIG. 1 is the desired $Z_1$.

In normal operation, the logic monitors the operating state of each of the on-line amplifiers, as represented by block 524. This block represents monitoring of the output power of each amplifier, and in order to prevent a drop in output power from being erroneously interpreted as a failure, the output signal power is correlated with input signal power and amplifier power-supply voltage. Thus, the logic represented by block 524 is a separate loop (not illustrated). The logic recurrently flows through a decision block 526, which returns the logic flow to block 524 so long as the output power is satisfactory.

In the event that the output power of an amplifier drops, the NO output of decision block 526 directs the logic to a block 528, which increments the value F of the failure register to F+1, representing the placing in use of one of the N-M spare amplifiers. All the amplifiers are deenergized in block 530, and the failed amplifier is removed from the on-line register in block 532. Decision block 534 determines whether any spare amplifiers remain by comparing the current value of F with N−(M−1). If F is less than N−(M−1), the YES output of decision block 534 directs the logic to block 536, in which the designation of the next spare in sequence is added to the on-line register. The logic flows from block 536 back to block 518, in which the procedure of bringing the on-line amps to operating status is begun, to bring the composite amplifier to a configuration with a full complement of amplifiers in operation, to provide full power operation.

If F=N−(M−1), the number of failed amplifiers exceeds the number of spares, there are no spares left, and the NO output of decision block 534 directs the logic to a further decision block 538, in which the current value of F is compared with N, the total number of amplifiers available. So long as F does not equal N, there are still operable amplifiers available, so that at least a reduced-power configuration can be achieved. If F≠N, the NO output of decision block 538 directs the logic to block 518 to begin turn-on in the reduced power configuration. The YES output of decision block 538 (all amplifiers failed) turns off the now-useless composite amplifier to conserve power.

The logic flow described in conjunction with FIG. 5 may be autonomous, or may include stops for human approval or decision. Furthermore, the control logic may be physically located remotely, as on a satellite, for the control of the satellite transmitter, or may be located at a ground station and connected to the composite amplifier by telemetry links.

Other embodiments of the invention will be apparent to those skilled in the art. In particular, switches such as switch 46 of FIG. 1 may be located at a position such that the length of short-circuited transmission line 68 of FIG. 1 has an effective length near zero, whereby the length of transmission line 54 of FIG. 1 (plus the electrical length of switch 46) is an odd multiple of one-quarter wavelength. Also, other types of impedance transformers may be used instead of a quarter wavelength transmission line having an impedance $\sqrt{Z_1 Z_2}$, as described in conjunction with FIG. 2a. For example, a stepped or continuous-taper transmission line may be used, as known in the art, or a discrete transformer with primary and secondary windings may be appropriate for certain frequency ranges and bandwidths.

What is claimed is:

1. A composite amplifier arrangement for amplifying signals from a source of signals, comprising:

power dividing means coupled to said source of signals for dividing the power of said signals into a plurality, equal to an integer N, of equal signal portions, each of said plurality of equal signal portions being coupled to one of N output terminals of said power dividing means;

a plurality N of amplifier modules, each including an input terminal coupled to one of said output terminals of said power dividing means for receiving one of said signal portions therefrom, and each also including an output terminal at which an amplified signal portion may be produced;

power combining means including N input terminals joined at a junction, and also including an output terminal having an output impedance value of $Z_1$, said power combining means including impedance transforming means coupled to said junction and to said output terminal, said impedance transforming means providing an impedance transformation between said value $Z_1$ and a value $Z_2$, where $Z_2$ equals $Z_1$ divided by M, where M is an integer less than N;

a plurality equal to N of switched transmission line arrangements, each of said switched transmission line arrangements including a single pole, double throw switch including first and second switched terminals and a common terminal, each of said switched transmission line arrangements also including a first transmission line extending from said output terminal of one of said amplifier modules to said first switched terminal of the associated switch, each of said switched transmission line arrangements further including a second transmission line extending from said common terminal of said associated switch to one of said input terminals of said power combining means, for coupling said amplified signal portion to said junction in a first state of said associated switch in which said associated switch has said first switched terminal connected to said common terminal, each of said switched transmission line arrangements further including a short-circuited transmission line coupled to said second switched terminal of said associated switch for coupling said short-circuited transmission line to said junction in a second state of said associated switch in which said associated switch has, said second switched terminal coupled to said common terminal, the electrical distance from said junction to any short-circuit of one of said short-circuited transmission lines in said second state of said associated switch being equal to the product of a sum multiplied by one-quarter wavelength at a frequency within the band of frequencies over which the composite amplifier is intended to operate, where said sum is the sum of the integer one plus twice a second integer, where said second integer may include zero; and control means coupled to said switches of said plurality of switched transmission lines for setting a number equal to M of said switches to said first state and the remainder of said switches to said second state.

2. An arrangement according to claim 1, wherein the value of impedance at said output terminal of said power combining means $Z_1$ is 50 ohms.

3. An arrangement according to claim 1 wherein each of said output terminals of said amplifier modules has an output impedance equal to $Z_1$.

4. An arrangement according to claim 1 wherein said source of signal has an output impedance of $Z_1$, and said power dividing means has input and output impedances of $Z_1$.

5. An arrangement according to claim 1, wherein the output impedance of said power combining means has impedance $Z_1$ approximately equal to 50 ohms;

said plurality N equals six;

the value of M is four, whereby said impedance transforming means provides an impedance $Z_2$ approximately equal to 12.5 ohms at said junction; and said second integer is zero, whereby each of said switched transmission lines in said second state of the associated switch has said short circuit at an electrical distance of one-quarter wavelength from said junction, thereby presenting an open circuit to said junction which does not perturb the impedance at said junction.

6. An arrangement according to claim 1, wherein said impedance transforming means comprises a transmission line having a length equal to one-quarter wavelength at said frequency within the band of frequencies over which the composite amplifier is intended to operate, and a characteristic impedance which is the square root of the product of said impedance $Z_1$ and said impedance $Z_2$.

7. A composite amplifier arrangement for amplifying signals from a source of signals, comprising:

power dividing means adapted to be coupled to said source of signals for dividing the power of said signals into a plurality, N, of equal sized signal portions, each of said plurality of equal sized signal portions being produced at one of N output terminals of said power dividing means;

a plurality N of amplifier modules, each including an input terminal coupled to one of said N output terminals of said power dividing means for receiving one of said equal-sized signal portions, and each including an output terminal at which amplified signal may be produced;

power combining means including N input terminals joined at a junction, and also including an output terminal having a characteristic impedance of $Z_l$ at which combined power is produced, said power combining means including impedance transforming means coupled between said junction and said output terminal, said impedance transforming means providing an impedance transformation between $Z_1$ and $Z_2$, where $Z_2$ equals $Z_1$ divided by M, where M is an integer less than N;

a plurality equal to N of first transmission lines including first and second ends, each of said first transmission lines being coupled at said first end to one of said input terminals of said power combining means;

a plurality equal to N of single pole, double throw switches, each including a common terminal coupled to said second end of one of said first transmission lines, and each also including first and second switched terminals;

a plurality equal to N of second transmission lines, each including a first end and a second end, said first end of each of said second transmission lines being coupled to said first switched terminal of one of said switches, said second end of each of said second transmission lines being coupled to said output terminal of one of said amplifier modules, whereby in a first state of one of said switches, said output terminal of one of said amplifier modules is coupled to said junction by way of one of said second transmission lines, said first and common terminals of one of said switches, and one of said first transmission lines;

a plurality equal to N of short-circuited transmission lines, each including a short-circuit and a first end, said first end of each of said short-circuited transmission lines being coupled to said second switched terminal of one of said switches, whereby each of said switches in a second state decouples said output terminal of one of said amplifier modules from said junction, and couples said short-circuit to said junction by way of a path which has an electrical length from said junction equal to the product of a sum multiplied by one-quarter wavelength, where said sum is the sum of the integer one plus twice a second integer, and where said second integer may be zero; and control means coupled to said plurality equal to N of switches for setting M of said switches to said first state and the remainder of said switches to said second state.

8. An amplifier arrangement according to claim 7 wherein said first and second transmission lines have characteristic impedances of $Z_1$.

9. An amplifier arrangement according to claim 7 wherein said second integer is zero, whereby said electrical length from said short-circuit to said junction in said second state of one of said switches is one-quarter wavelength.

10. An amplifier arrangement according to claim 7 wherein N equals 6, M equals 4, $Z_1$ equals 50 ohms, and $Z_2$ equals 12.5 ohms.

11. An amplifier arrangement according to claim 10 wherein said second integer is zero, whereby said electrical length from said short-circuit to said junction in said second state of one of said switches is one-quarter wavelength.

* * * * *